United States Patent
Eom (10) Patent No.: US 7,990,050 B2
(45) Date of Patent: Aug. 2, 2011

(54) ORGANIC LIGHT EMITTING DISPLAY HAVING AUXILIARY ELECTRODE

(75) Inventor: Ji-Hye Eom, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 124 days.

(21) Appl. No.: 12/366,202

(22) Filed: Feb. 5, 2009

(65) Prior Publication Data

US 2010/0060147 A1    Mar. 11, 2010

(30) Foreign Application Priority Data

Sep. 5, 2008  (KR) .................. 10-2008-0087882

(51) Int. Cl.
*H01J 1/62* (2006.01)
*H01J 63/04* (2006.01)

(52) U.S. Cl. ........................ 313/504; 313/505

(58) Field of Classification Search .......... 313/504, 313/505
See application file for complete search history.

(56) References Cited

U.S. PATENT DOCUMENTS

| | | | | |
|---|---|---|---|---|
| 6,366,025 B1 * | 4/2002 | Yamada | ..................... | 315/169.3 |
| 6,771,028 B1 * | 8/2004 | Winters | ..................... | 315/169.1 |
| 7,042,154 B2 * | 5/2006 | Kobayashi | ..................... | 313/506 |
| 7,619,244 B2 * | 11/2009 | Murakami et al. | ............... | 257/40 |
| 2002/0186214 A1 * | 12/2002 | Siwinski | ..................... | 345/212 |
| 2005/0127828 A1 * | 6/2005 | Chung et al. | ..................... | 313/504 |
| 2005/0179374 A1 * | 8/2005 | Kwak | ..................... | 313/506 |
| 2006/0113900 A1 * | 6/2006 | Oh | ..................... | 313/504 |
| 2007/0023734 A1 * | 2/2007 | Igarashi et al. | ......... | 252/301.4 S |
| 2008/0018243 A1 * | 1/2008 | Ishiguro et al. | ............... | 313/506 |
| 2008/0224968 A1 * | 9/2008 | Kashiwabara | ..................... | 345/83 |
| 2008/0272992 A1 * | 11/2008 | Kwak | ..................... | 345/76 |

FOREIGN PATENT DOCUMENTS

| | | |
|---|---|---|
| JP | 2003068472 | 3/2003 |
| JP | 2006059796 | 3/2006 |
| JP | 2007188751 | 7/2007 |

* cited by examiner

*Primary Examiner* — Nimeshkumar D Patel
*Assistant Examiner* — Glenn Zimmerman
(74) *Attorney, Agent, or Firm* — H.C. Park & Associates, PLC

(57) ABSTRACT

The present invention provides an organic light emitting display (OLED). The OLED includes a substrate, a first electrode arranged on a subpixel area of the substrate, an organic light emitting layer arranged on the first electrode, and a second electrode arranged on the organic light emitting layer, which extends to a non-subpixel area. An auxiliary electrode that is connected to the second electrode is arranged on the substrate, thereby the auxiliary electrode applies a same voltage as that of the second electrode.

19 Claims, 7 Drawing Sheets

ORGANIC LIGHT EMITTING DISPLAY HAVING AUXILIARY ELECTRODE

CROSS REFERENCE TO RELATED APPLICATION

This application claims priority from and the benefit of Korean Patent Application No. 2008-87882, filed on Sep. 5, 2008, which is hereby incorporated by reference for all purposes as if fully set forth herein.

BACKGROUND OF THE INVENTION

1. Field of the Invention

The present invention relates to an organic light emitting display OLED. More particularly, the present invention relates to an OLED capable of improving the quality of an image by using an auxiliary electrode.

2. Discussion of the Background

Recently, technologies related to devices for a display apparatus have become important. In this regard, an OLED has been spotlighted as a display apparatus capable of displaying natural colors.

The OLED includes a cathode, an anode, and an organic light emitting layer formed between the cathode and the anode. The organic light emitting layer is disposed between a conductive electrode having a high work function and a conductive electrode having a low work function to generate light, so that an image is displayed. Generally, in the OLED, the conductive electrode having the high work function is used as an anode, through which holes are injected into the organic light emitting layer, and the conductive electrode having the low work function is used as a cathode, through which electrons are injected into the organic light emitting layer.

One electrode of the OLED includes transparent material, which rarely absorbs light in a wavelength band of emitted light, to emit the light out of the OLED.

The principle of the OLED having the electrodes described above is as follows. As the holes and electrons are injected into the organic light emitting layer through the anode and the cathode, respectively, excitons are generated in the organic light emitting layer. When the holes and the electrons combine, the excitons are emitted and decay with light having a particular wavelength that is generated corresponding to the differential energy between the lowest unoccupied molecular orbital LUMO and the highest occupied molecular orbital HOMO.

The cathode or the anode, through which light forming an image travels, is prepared as a transparent electrode.

However, when the transparent electrode is formed on the entire surface of a display unit, the transparent electrode should be thinly formed to increase light transmittance and to protect the organic light emitting layer. Thus, resistance on an entire surface of the transparent electrode may not be uniform, so that a voltage drop may occur.

Additional auxiliary electrodes may be provided outside each pixel to overcome the voltage drop. However, an aperture ratio of the pixel may be reduced because additional spaces are used for the auxiliary electrodes.

SUMMARY OF THE INVENTION

The present invention provides an OLED that may improve the uniformity of an image and increase an aperture ratio of the display device by using an auxiliary electrode simply formed without an additional photolithography process.

Additional features of the invention will be set forth in the description which follows, and in part will be apparent from the description, or may be learned by practice of the invention.

The present invention discloses an OLED that includes a substrate and a plurality of pixels arranged on the substrate. The pixel includes a plurality of subpixels surrounded by a non-subpixel area. A first electrode is arranged on each subpixel and an organic light emitting layer is arranged on the first electrode. A part of the organic light emitting layer extends to the non-subpixel area, thereby the organic light emitting layer is arranged on a part of the non-subpixel area. The non-subpixel area is divided into a first area, where the organic light emitting layer is arranged, and a second area, where the organic light emitting layer is not arranged. A second electrode is arranged on the organic light emitting layer. The second electrode covers an entire surface of the substrate having the organic light emitting layer. An auxiliary electrode is arranged in the second area of the non-subpixel area and is connected to the second electrode. The auxiliary electrode applies auxiliary voltage to the second electrode.

The present invention also discloses an OLED that includes a substrate and a plurality of pixels arranged on the substrate. The pixel includes a plurality of subpixels surrounded by a non-subpixel area. A first electrode is arranged on each subpixel and an organic light emitting layer is arranged on the first electrode. Each subpixel has rounded vertices. A second electrode is arranged on the organic light emitting layer and a part of the non-subpixel area. An auxiliary electrode is connected to the second electrode to apply an auxiliary voltage to the second electrode, and the auxiliary electrode is arranged in the non-subpixel area and between vertices of the subpixels.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DESCRIPTION OF THE ILLUSTRATED EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 1:
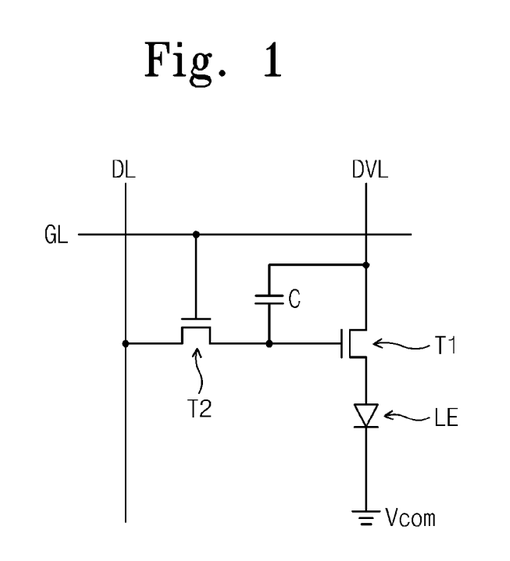
FIG. 1 is an equivalent circuit diagram of one subpixel of an OLED according to a first exemplary embodiment of the present invention.

FIG. 1 is an equivalent circuit diagram of one subpixel of a top emission OLED according to a first exemplary embodiment of the present invention.

Referring to FIG. 1, a substrate includes a plurality of gate lines GL extending in a first direction, and a plurality of data lines DL extending in a second direction. The data lines cross the gate lines to define subpixels, respectively. A plurality of transistors is formed on an area adjacent to where the gate lines and the data lines cross, respectively.

A driving voltage line DVL crossing the gate line GL is formed parallel to the data line DL. A scan signal is transferred through the gate line GL, and a data signal is transferred through the data line DL. The driving voltage is applied to the driving transistor T1 through the driving voltage line DVL.

Each subpixel includes an organic light emitting element LE, the driving transistor T1 to control holes or electrons that are supplied to the organic light emitting element LE, the switching transistor T2 to switch the driving transistor T1, and a capacitor C.

The driving transistor T1 includes a gate electrode, a source electrode, and a drain electrode. The gate electrode is connected to the switching transistor T2, the source electrode is connected to the driving voltage line DVL, and the drain electrode is connected to a first electrode of the organic light emitting element LE. The organic light emitting element LE emits light in response to an output signal of the driving transistor T1 to display an image.

The switching transistor T2 includes a gate electrode, a source electrode, and a drain electrode. The gate electrode is connected to the gate line GL, the source electrode is connected to the data line DL, and the drain electrode is connected to the gate electrode of the driving transistor T1. The switching transistor T2 transfers a data signal that is applied to the data line DL to the driving transistor T1 according to the scan signal applied to the gate line GL.

The capacitor C is connected between the gate electrode and the source electrode of the driving transistor T1 to charge the data signal input to the gate electrode of the driving transistor T1.

In the OLED having the circuit configuration described above, since a second electrode is formed on the entire surface of the substrate, a voltage drop may occur in an area distant from a voltage supply wire (not shown), which supplies the common voltage Vcom.

In the case of the top emission OLED in which light passes through the second electrode, a thickness of the second electrode is limited to a predetermined range in order to prevent luminance from decreasing. As the thickness of the second electrode is limited, the thickness of the second electrode decreases, so that resistance may increase.

Further, when voltage is applied to the second electrode, power is supplied to the outer peripheral portion of the second electrode, so that resistance uniformity on the entire surface of the second electrode may deteriorate.

The first exemplary embodiment of the present invention having the circuit configuration described above includes an auxiliary electrode that additionally applies a voltage having a same level to that of the voltage applied to the second electrode, which may improve resistance uniformity in the second electrode. The auxiliary electrode is connected to the second electrode.

Figure 2:
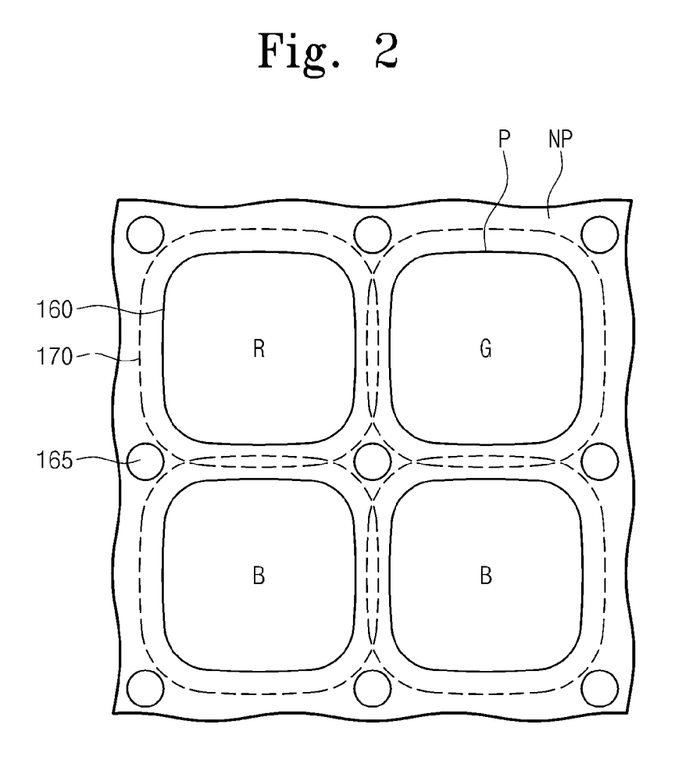
FIG. 2 is a plan view showing one pixel of an OLED according to a first exemplary embodiment of the present invention.
Figure 3:
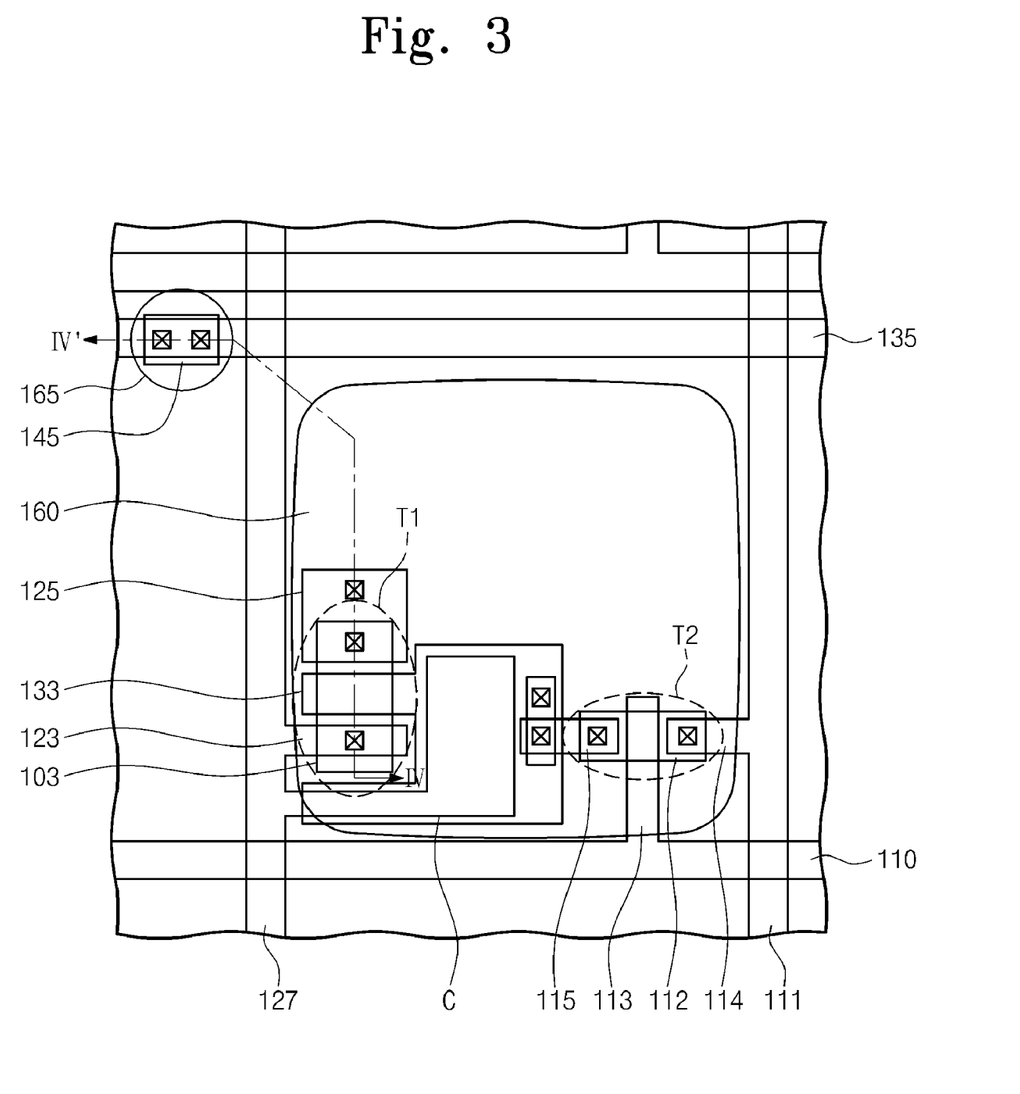
FIG. 3 is a plan view showing one subpixel of the pixel in FIG. 2.
Figure 4:
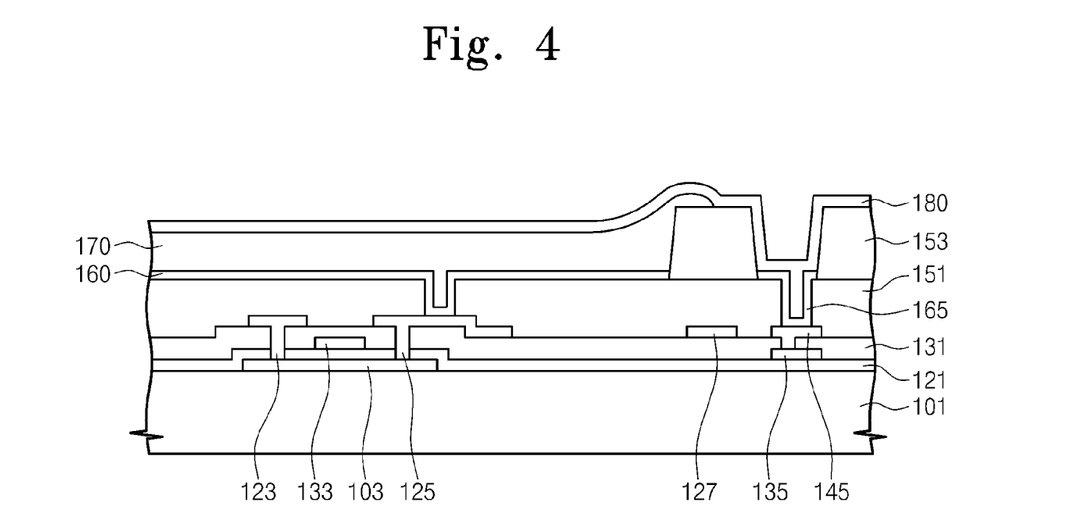
FIG. 4 is a sectional view taken along line IV-IV' in FIG. 3.

FIG. 2 is a plan view showing one pixel of the OLED according to the first exemplary embodiment of the present invention, FIG. 3 is a plan view showing one subpixel of the pixel in FIG. 2, and FIG. 4 is a sectional view taken along line IV-IV' in FIG. 3. Substantially, the OLED includes a plurality of pixels. For the convenience of explanation, one pixel is representatively described as an example.

Referring to FIG. 2, FIG. 3, and FIG. 4, the OLED according to the first exemplary embodiment of the present invention includes a substrate 101 having a plurality of pixels.

The substrate 101 has a rectangular plate shape. The substrate 101 may be made of an insulating material such as glass, quartz, ceramic, or plastic.

Referring to FIG. 2, each pixel includes a plurality of subpixels P. A non-subpixel area NP is disposed around the subpixels P while surrounding the subpixels P.

The subpixels P each have substantially the same shape and size. Each subpixel P of the present exemplary embodiment has a substantially rectangular shape. Each subpixel P may alternately have a square shape. Each subpixel P has four curvature sections at vertexes thereof. The vertex formed between two adjacent sides of each subpixel P is rounded.

Referring to FIG. 3 and FIG. 4, driving and switching transistors T1 and T2, a first electrode 160, an organic light emitting layer 170, and a second electrode 180 are formed on the substrate 101. The subpixel P is defined by gate line 110 extending in one direction on the substrate 101, and data line 111 crossing the gate line 110. In each subpixel P, the driving transistor T1 and the switching transistor T2 are formed on an area adjacent to where the gate line 110 and the data line 111 cross in the subpixel P. The switching transistor T2 switches the driving transistor T1. The first electrode 160 is connected to the driving transistor T1. The organic light emitting layer 170 is formed on the first electrode 160, and the second electrode 180 is formed on the organic light emitting layer 170. The organic light emitting layer 170 is formed on the first electrode 160, as well as a part of the non-subpixel area NP.

A protective layer 151 is formed between the driving transistor T1 and the first electrode 160.

The driving transistor T1 includes a semiconductor layer 103, a gate insulating layer 121, a gate electrode 133, an interlayer insulator 131, a source electrode 123, and a drain electrode 125. The semiconductor layer 103 is formed on the substrate 101. The gate insulating layer 121 is formed on the entire surface of the substrate 101 including the semiconductor layer 103. The gate electrode 133 is formed above the semiconductor layer 103 on the gate insulating layer 121 while being insulated from the semiconductor layer 103. The interlayer insulator 131 is formed on the entire surface of the substrate 101 having the gate electrode 133. The source and drain electrodes 123 and 125 are formed on the interlayer insulator 131 and are spaced apart from each other, while the gate electrode 133 is disposed therebetween. The source electrode 123 is branched from a power line 127. The source and the drain electrodes 123 and 125 are connected respectively to the semiconductor layer 103 through contact holes that pass through the interlayer insulator 131 and the gate insulating layer 121.

The second transistor T2 includes a semiconductor layer 112 formed on the substrate 101, a gate electrode 113 branched from the gate line 110 formed on the semiconductor layer 112, and source and drain electrodes 114 and 115 spaced apart from each other, while the gate electrode 113 is disposed therebetween. The drain electrode 115 is connected to the gate electrode 133 of the driving transistor T1.

The semiconductor layers 103 and 112 may include an active layer containing amorphous silicon or polycrystalline silicon, or an ohmic contact layer doped with impurities.

The protective layer 151 is formed on the entire surface of the substrate 101 that has the source electrodes 114 and 123 and the drain electrodes 115 and 125. The protective layer 151 may be formed using an organic material or an inorganic material. For example, the inorganic layer may include silicon oxide or silicon nitride. The organic layer may include one selected from the group consisting of benzocyclobutene (BCB) based material, olefin-based material, acrylic resin-based material, polyimide-based material, Teflon (trademark)-based material, cytop, and perfluorocyclobutane (FCB).

The first electrode 160, which is connected to the drain electrode 125 of the driving transistor T1, includes metal with low resistance. In addition, the first electrode 160 may include transparent conductive material such as indium tin oxide (ITO) or indium zinc oxide (IZO).

A partition 153 is formed on the non-subpixel area NP of each subpixel P to surround the first electrode 160. The partition 153 may include photoresist material with heat resistance and solvent resistance properties, such as acryl resin or polyimide resin, or an inorganic material such as $SiO_2$ or $TiO_2$. Further, the partition 153 may have a dual layer structure including an organic layer and an inorganic layer.

The organic light emitting layer 170 is formed on a portion of the first electrode 160 that is not covered by the partition 153. The organic light emitting layer 170 may contain high molecular weight material. The organic light emitting layer 170 may have a single layer structure or a multilayer structure. When the organic light emitting layer 170 has a multilayer structure, the organic light emitting layer 170 may include a hole injecting layer, a light emitting layer, an electron injecting layer, and the like. In addition, the organic light emitting layer 170 may further include a hole transfer layer, an electron transfer layer, and the like.

The organic light emitting layer 170 may emit light of red R, green G, blue B, and white W, or light of red R, green G, and blue B. The subpixel P having the color can be arranged in a predetermined order. In addition, such a specific order can be changed. Further, since the subpixels P include the organic light emitting layer 170 with differences in luminance or endurance, each subpixel P with colors may be arranged by taking the difference into consideration. For example, since the organic light emitting layer 170 emitting blue light has low luminance, two blue subpixels P can be aligned in one pixel.

The organic light emitting layer 170 can be provided only on the first electrode 160, or can extend to a part of an upper portion of the partition 153. This is because the organic light emitting layer 170 may be exposed outside a mask with a margin when the organic light emitting layer 170 is formed through a deposition process.

The second electrode 180 is formed with conductive material on the organic light emitting layer 170.

According to the first exemplary embodiment of the present invention, light is emitted in a direction from the first electrode 160 to the second electrode 180, i.e. the OLED of the present exemplary embodiment is a top emission OLED. Thus, the second electrode 180 includes transparent conductive material such that the light generated from the organic light emitting layer 170 can transmit to the entire surface of the second electrode 180. The second electrode 180 may be made of one of calcium, barium, magnesium, aluminum, and an alloy thereof. The first electrode 160 may include transparent conductive material or opaque conductive material.

The first and second electrodes 160 and 180 may include various materials. Among them, an electrode including material having a lower work function serves as a cathode through which electrons are injected, and an electrode including material having a higher work function serves as an anode through which holes are injected. Thus, the holes transferred through the anode and the electrons transferred through the cathode are combined in the light emitting layer to form excitons, so that light is emitted.

The second electrode 180 is formed on the entire surface of the substrate 101 having the organic light emitting layer 170. The reference mark C denotes the capacitor.

Referring to FIG. 2, FIG. 3, and FIG. 4, an auxiliary electrode 165 is provided on the non-subpixel area NP among the subpixels P of the substrate 101 to apply an auxiliary voltage to the second electrode 180. The auxiliary electrode 165 is connected to the second electrode 180.

The auxiliary electrodes 165 are formed on the non-subpixel area NP, where the organic light emitting layer 170 is not formed, so that the auxiliary electrode 165 is spaced apart from the organic light emitting layer 170. In the non-subpixel area NP, if a part defined by the organic light emitting layer 170 is referred to as a first area, and a part where the organic light emitting layer 170 is not formed is referred to as a second area, the auxiliary electrodes 165 are formed in the second area.

According to the first exemplary embodiment of the present invention, the auxiliary electrodes 165 are formed on the non-subpixel area NP among the vertices of the four subpixels P due to a deposition margin of the organic light emitting layer 170.

As shown in FIG. 2 and FIG. 3, if the organic light emitting layer 170 is formed through a deposition method, the organic light emitting layer 170 extends to the non-subpixel area NP of the subpixels P of the first electrode 160 even if a mask exactly corresponding to the first electrode 160 is used. The organic light emitting layer 170 extending to the non-subpixel area NP may overlap another organic light emitting layer 170 producing another color on the non-subpixel area NP, so that color may be mixed. Thus, the subpixels P should be spaced apart from each other by a predetermined distance such that the color mixing can be hidden by the partition 153. Since the deposition margin of the organic light emitting layer 170 is about 30 μm at maximum, the subpixels P may have an interval of about 30 μm therebetween.

According to the first exemplary embodiment of the present invention, the auxiliary electrode 165 is formed on the part of the non-subpixel area NP that has no organic light emitting layer 170, that is, the auxiliary electrode 165 is formed among the vertices of the subpixels P. Since each subpixel P is not prepared as a square shape, but has curvature sections at the vertices thereof, an interval between the adjacent subpixels P can be minimized and the non-subpixel area NP between the adjacent vertices can be widened as compared with a square subpixel. Thus, the part of the non-subpixel area NP that has no organic light emitting layer 170 can be formed even if the deposition margin of the organic light emitting layer 170 is considered.

The non-subpixel area NP, except for the auxiliary electrodes 165, is surrounded by the partition 153 and the part of the non-subpixel area NP that has the auxiliary electrodes 165 serves as an opening having no partition 153. The second electrode 180 is connected to the auxiliary electrodes 165 through the opening of the partition 153.

The auxiliary electrode 165 and the first electrode 160 may include the same material and can be formed on the same layer through the same manufacturing process in single step. For example, the auxiliary electrode 165 and the first electrode 160 can be simultaneously formed by depositing conductive material on the entire surface of the protective layer 151 and patterning the conductive material using a photolithography process.

Power is supplied to the auxiliary electrodes 165 through additional auxiliary electrode lines 135. The auxiliary electrode lines 135 can be formed on the non-subpixel area NP parallel to the gate line 110.

The auxiliary electrode lines 135 and the gate line 110 may include the same material and can be formed on the same layer through the same manufacturing process in one process.

The auxiliary electrode line 135 may be electrically connected to the auxiliary electrode 165. In addition, the auxiliary electrode line 135 may be electrically connected to the auxiliary electrode 165 through an auxiliary electrode connection line 145. Referring to FIG. 4, the auxiliary electrode line 135 is formed on the gate insulating layer 121 and the interlayer insulator 131 is formed on the auxiliary electrode lines 135. The interlayer insulator 131 has a contact hole that exposes a part of the auxiliary electrode line 135. The auxiliary electrode line 135 is connected to the auxiliary electrode connection line 145 that is formed on the interlayer insulator 131 through the contact hole.

The auxiliary electrode connection line 145 and the source and drain electrodes 123 and 125 may include the same material and can be formed on the same layer through the same manufacturing process in single step.

The protective layer 151, which has a contact hole that exposes a part of the auxiliary electrode connection line 145, is formed on the auxiliary electrode connection line 145. The auxiliary electrodes 165 are formed on the protective layer 151 to be connected to the auxiliary electrode connection line 145 through the contact hole.

The auxiliary electrodes 165 may not be formed in each pixel or each subpixel P in each pixel. Preferably, the auxiliary electrodes 165 are formed to apply a voltage to the second electrode 180. In addition, the auxiliary electrodes 165 may be randomly formed.

As described above, the auxiliary electrode line 135 is electrically connected to the auxiliary electrode 165 to apply a voltage to the auxiliary electrode 165. The voltage applied to the auxiliary electrode 165 may have a same level to that of the voltage applied to the second electrode 180. Further, the auxiliary electrode 165 and the second electrode 180 can receive a voltage from the same power source. The voltage applied to the auxiliary electrode 165 is finally applied to the second electrode 180 connected to the auxiliary electrode 165. Thus, a voltage drop in the second electrode 180 can be prevented.

The OLED having the structure described above according to the first exemplary embodiment of the present invention includes the auxiliary electrode 165 that assists the voltage applied to the second electrode 180, which may allow the second electrode 180 to have uniform resistance and reduce the entire resistance of the OLED. Thus, the voltage drop in the second electrode 180 can be prevented.

Further, the auxiliary electrode 165 can be formed without any additional process. Furthermore, a space for the auxiliary electrode 165 can be ensured without widening the interval between the subpixels P or preparing an additional space. In detail, the auxiliary electrode 165 can be formed by simply making vertices of the subpixel P round. In addition, since the auxiliary electrode 165 is formed in the space defined by the overlap portions of the subpixels P, which is covered with the partition 153 to block the mixed light, an aperture ratio of the display device can be maximized.

According to the first exemplary embodiment of the present invention as described above, the subpixels P have the same size and shape, so that the manufacturing process can be performed by using a single mask while changing positions of the single mask. However, the scope of the present invention is not limited thereto. The subpixels P may have various sizes and shapes.

Figure 5:
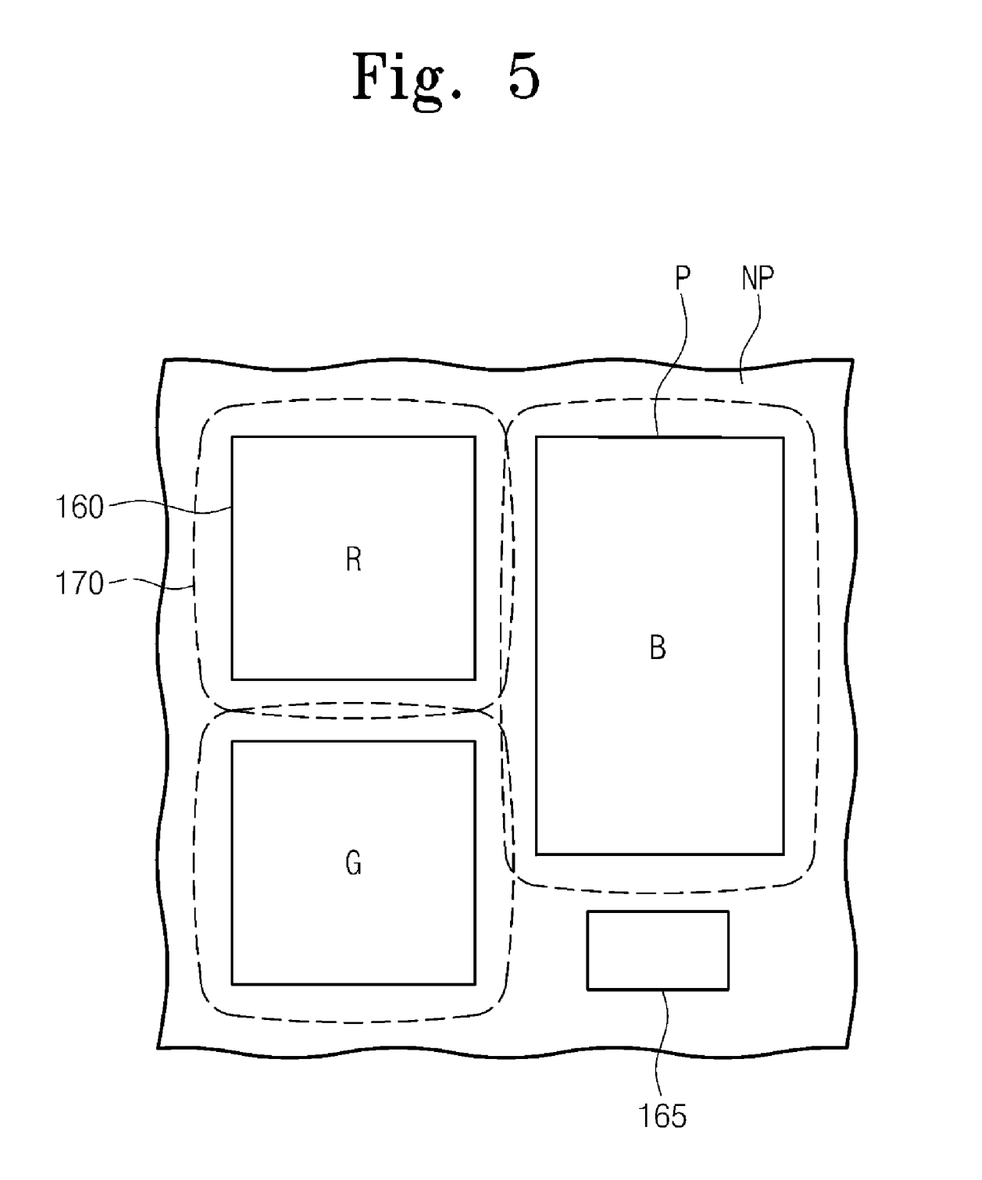
FIG. 5 is a plan view showing one pixel of an OLED according to a second exemplary embodiment of the present invention.
Figure 6:
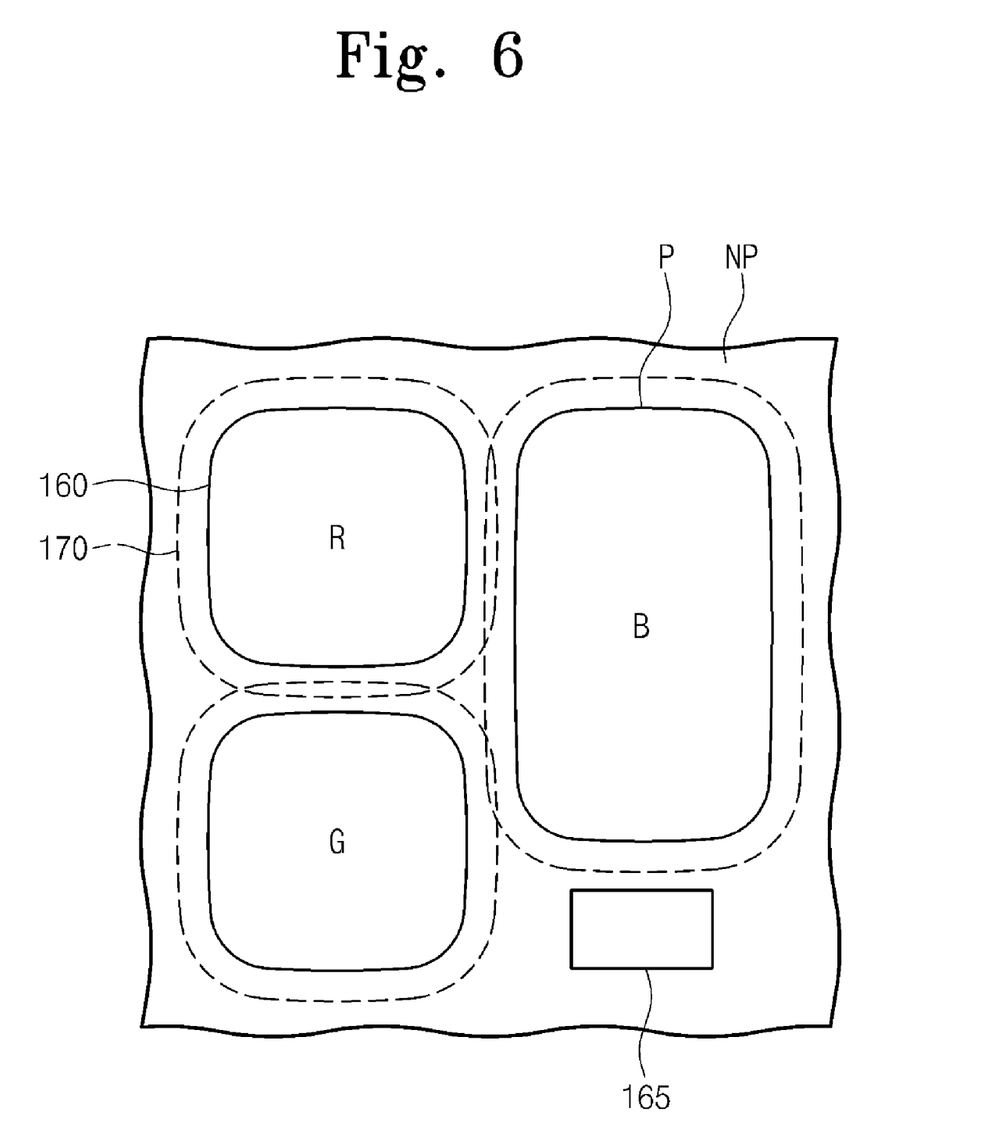
FIG. 6 is a plan view showing one pixel of an OLED according to a third exemplary embodiment of the present invention.

FIG. 5 and FIG. 6 are plan views showing one pixel including subpixels having various sizes according to second and third exemplary embodiments of the present invention. In the second exemplary embodiment, each subpixel P has a rectangular shape having vertices. In the third embodiment, each subpixel P has curvature sections at vertices thereof.

Referring to FIG. 5 and FIG. 6, one pixel includes a plurality of subpixels P. A non-subpixel area NP is disposed around each subpixel P to surround each subpixel P. The subpixels P may have an asymmetrical configuration with different sizes. The second and third exemplary embodiments include two subpixels having the same size and one subpixel having a size larger than that of the two subpixels.

The organic light emitting layer 170 is formed on the subpixel P, and a part of the organic light emitting layer 170 extends to the non-subpixel area NP. The organic light emitting layer 170 emits light of red R, green G, or blue B. The subpixel P having the color can be aligned in a predetermined order. In addition, the predetermined order can be changed. Further, since the subpixels P, which includes the organic light emitting layer 170 with each color representing differences in luminance or endurance, the subpixels P are aligned by taking the size of the subpixels P into consideration. For example, since the organic light emitting layer 170 emitting blue light has low luminance, the organic light emitting layer 170 emitting blue light can be disposed in the largest subpixel of the pixel.

Similar to the first exemplary embodiment, the organic light emitting layer 170 can extend to the non-subpixel area NP of the subpixels P. In the non-subpixel area NP, if a part defined by the organic light emitting layer 170 is referred to as a first area, and a part where the organic light emitting layer 170 is not formed is referred to as a second area, the second area can exist in a region adjacent to one side of the non-subpixel area because the subpixels P are disposed with different sizes. Since the subpixels P have the asymmetrical configuration and different sizes, one side of the non-subpixel area NP may have a size greater than that of the other side of the non-subpixel area NP about the subpixels P. In this case, the auxiliary electrode 165 is formed in the one side of the non-subpixel area NP having the relatively larger size. For example, referring to FIG. 5 and FIG. 6, a subpixel B having the largest size is disposed adjacent to subpixels R and G having sizes equal to or similar to each other. In this case, the second area having no organic light emitting layer 170 is provided at a region adjacent to one side of the subpixel B.

The non-subpixel area NP, except for the auxiliary electrode 165, is surrounded by the partition 153, and an area where the auxiliary electrode 165 is formed serves as an opening with no partition 153. The second electrode 180 is connected to the auxiliary electrode 165 through the opening.

Figure 7:
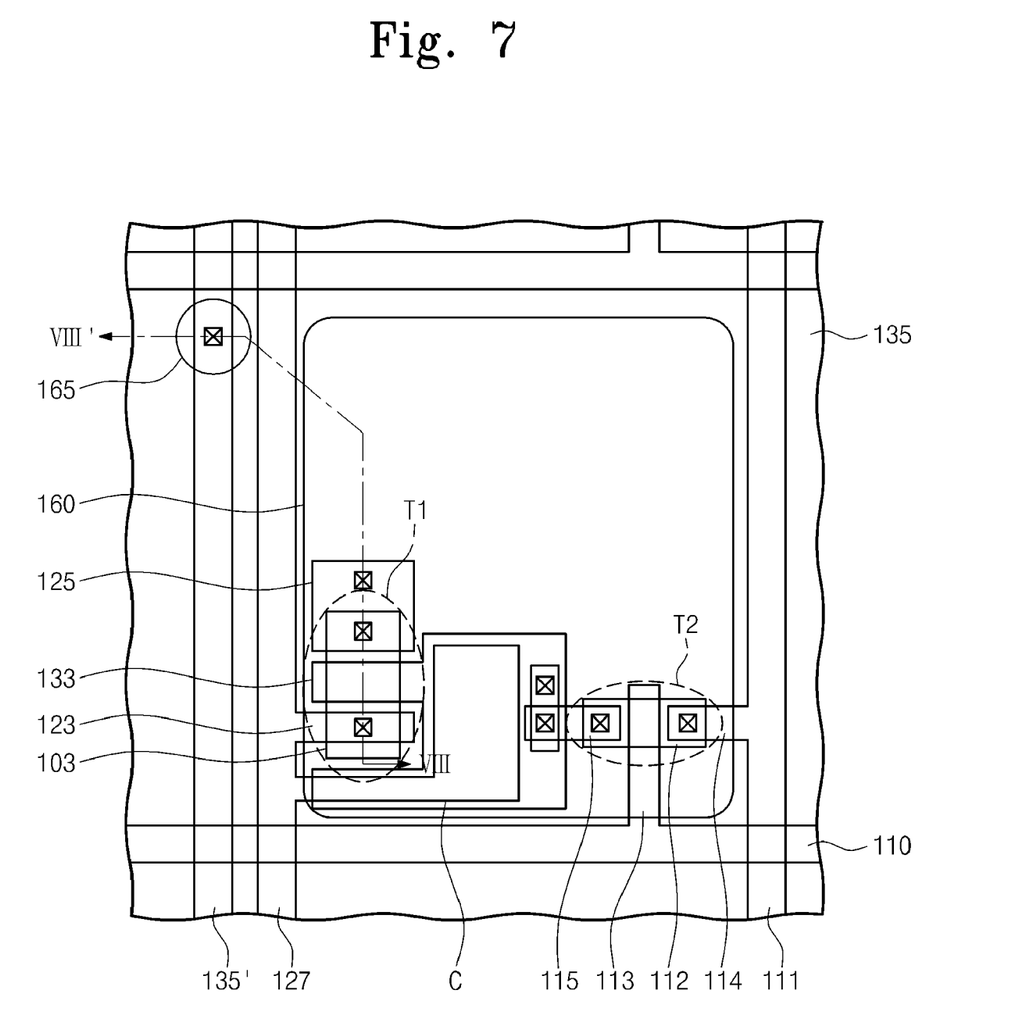
FIG. 7 is a plan view showing one subpixel of an OLED according to a fourth exemplary embodiment of the present invention.
Figure 8:
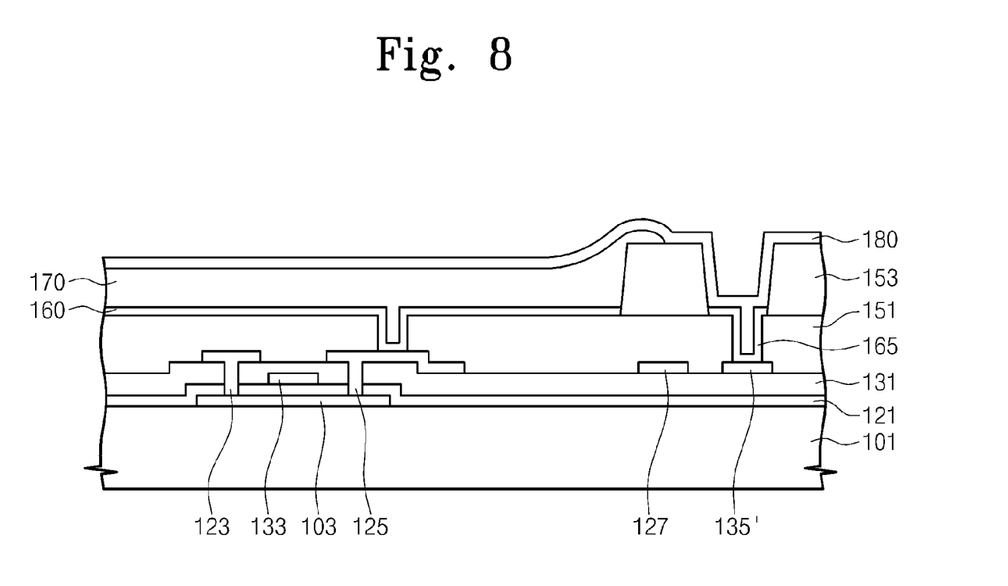
FIG. 8 is a sectional view taken along line VIII-VIII' in FIG. 7.

According to a fourth exemplary embodiment of the present invention, an auxiliary electrode line 135' can be parallel to the data line 111. FIG. 7 is a plan view showing one subpixel of the OLED according to the fourth exemplary embodiment of the present invention, and FIG. 8 is a sectional view taken along line VIII-VIII' in FIG. 7. In the fourth exemplary embodiment, only features different from those of the first exemplary embodiment will be described and description of elements the same as those of the first exemplary embodiment will be omitted in order to avoid redundancy.

According to the fourth exemplary embodiment, the auxiliary electrode line 135' and the source and drain electrodes 123 and 125 can be formed on the same layer through the same manufacturing process, thereby including the same material. The protective layer 151 is formed on the auxiliary electrode line 135'. The protective layer 151, which has a contact hole that exposes a part of the auxiliary electrode line 135', is formed, so that the auxiliary electrode 165 is directly connected to the auxiliary electrode line 135' through the contact hole. Thus, according to the fourth exemplary embodiment of the present invention, the auxiliary electrode connection line 145 of the first exemplary embodiment can be omitted.

Figure 9:
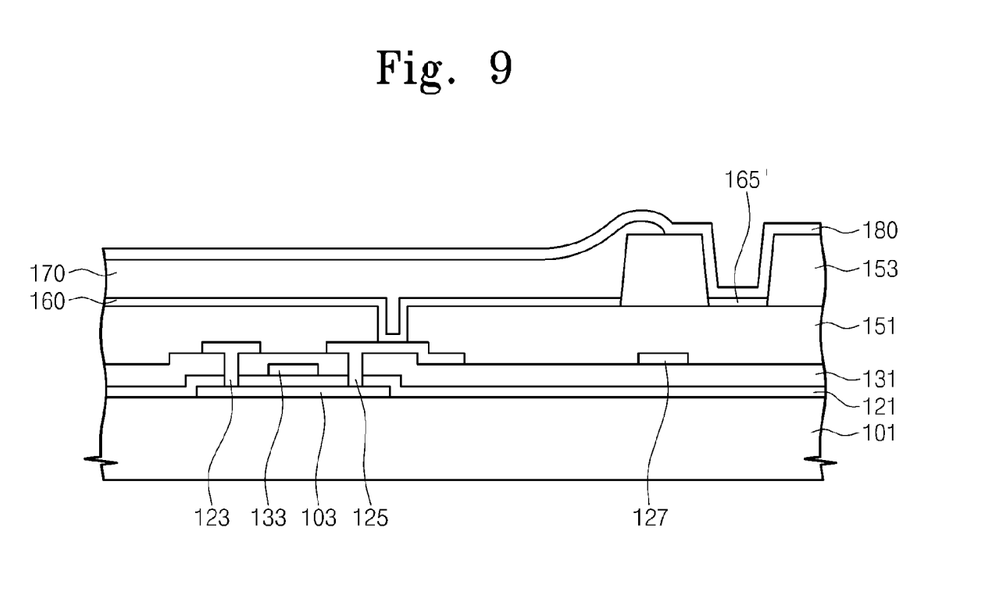
FIG. 9 is a sectional view showing one subpixel of a pixel in an OLED according to a fifth exemplary embodiment of the present invention.

FIG. 9 is a sectional view showing one pixel of the OLED according to a fifth exemplary embodiment of the present invention. FIG. 9 shows a section similar to a section shown in FIG. 4.

In the fifth exemplary embodiment, only features different from those of the first exemplary embodiment will be described and description of elements the same as those of the first exemplary embodiment will be omitted in order to avoid redundancy.

According to the fifth exemplary embodiment, an auxiliary electrode 165' is formed on the protective layer 151, and an auxiliary electrode line (not shown), which applies voltage to the auxiliary electrode 165', extends from the auxiliary electrode 165' and is integrally formed with the auxiliary electrode 165'. The partition 153 is formed on the auxiliary electrode line except on the auxiliary electrode 165'. The partition 153 has an opening formed on an area having the auxiliary electrode 165' to expose the auxiliary electrode 165'. Thus, the second electrode 180 is connected to the auxiliary electrode 165' through the opening.

The auxiliary electrode line may be formed on the protective layer 151 corresponding to the auxiliary electrode line 135 in FIG. 3. However, the scope of the present invention is not limited thereto. The auxiliary electrode line can be formed around the pixel in the non-subpixel area NP, around the subpixel P, at a region adjacent to one side of the pixel, or at a region adjacent to one side of the subpixel P.

As described above, the auxiliary electrode 165' is integrally formed with the auxiliary electrode line, so that additional wirings or an additional contact hole is not necessary and the auxiliary electrode 165' and the auxiliary electrode line can be simultaneously patterned through a single process.

The auxiliary electrode 165' and the first electrode 160 may include the same material and can be formed on the protective layer 151 through the same manufacturing process.

The auxiliary electrode line extends to the outer peripheral portion of the substrate 101 to receive a supply voltage. The supply voltage may have the same level as that of the voltage applied to the second electrode 180. The same power source can be used for both voltages.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display, comprising:
   a substrate;
   a plurality of pixels arranged on the substrate, each pixel having a plurality of subpixels surrounded by a non-subpixel area;
   a plurality of gate lines extending in a first direction on the substrate;
   a plurality of data lines extending in a second direction on the substrate, the data lines crossing the gate lines to define the subpixels together with the gate lines;
   a first electrode arranged on each subpixel;
   an organic light emitting layer arranged on the first electrode and a part of the non-subpixel area;
   a second electrode arranged on an entire surface of the substrate having the organic light emitting layer;
   an auxiliary electrode connected to the second electrode to apply an auxiliary voltage to the second electrode; and
   an auxiliary electrode line to apply a voltage to the auxiliary electrode, the auxiliary electrode line being arranged directly on the same layer as that of the gate lines or the data lines,
   wherein the non-subpixel area comprises a first area having the organic light emitting layer and a second area adjacent to the first area, and wherein the auxiliary electrode is arranged in the second area.

2. The organic light emitting display of claim 1, wherein each subpixel has a rectangular shape and the auxiliary electrode is positioned among vertices of the subpixels.

3. The organic light emitting display of claim 2, wherein the vertices of the subpixels are rounded, respectively.

4. The organic light emitting display of claim 1, wherein the pixel comprises four subpixels that produce red, green, blue, and blue colors, respectively.

5. The organic light emitting display of claim 1, wherein the pixel comprises four subpixels that produce red, green, blue, and white colors, respectively.

6. The organic light emitting display of claim 1, wherein the pixel comprises three subpixels, and at least one of the three subpixels has an area different from areas of remaining subpixels.

7. The organic light emitting display of claim 1, wherein the auxiliary electrode comprises the same material as the first electrode.

8. The organic light emitting display of claim 1, further comprising a partition arranged in the non-subpixel area to surround the organic light emitting layer, and wherein the partition has an opening exposing a portion of the auxiliary electrode.

9. The organic light emitting display of claim 8, wherein the second electrode is connected to the auxiliary electrode through the opening.

10. The organic light emitting display of claim 1, further comprising:
transistors connected to the gate lines and the data lines, respectively, to apply a voltage to the first electrode.

11. The organic light emitting display of claim 10, wherein each transistor comprises:
a semiconductor layer arranged on the substrate;
a gate electrode arranged on the semiconductor layer, the gate electrode being insulated from the semiconductor layer;
an interlayer insulator arranged on the gate electrode; and
a source electrode and a drain electrode spaced apart from each other on the interlayer insulator, with the source electrode and the drain electrode being connected to the semiconductor layer through contact holes, respectively.

12. The organic light emitting display of claim 1, wherein the auxiliary electrode line comprises the same material as the first electrode and is arranged directly on the same layer as that of the gate electrode.

13. The organic light emitting display of claim 1, further comprising an auxiliary electrode connection line arranged between the auxiliary electrode and the auxiliary electrode line to connect the auxiliary electrode to the auxiliary electrode line.

14. The organic light emitting display of claim 13, wherein the auxiliary electrode connection line comprises the same material as the source electrode and the drain electrode, and is arranged directly on the same layer as that of the source electrode and the drain electrode.

15. An organic light emitting display, comprising:
a substrate;
a plurality of pixels arranged on the substrate, each pixel having a plurality of subpixels surrounded by a non-subpixel area;
a first electrode arranged on each subpixel;
an organic light emitting layer arranged on the first electrode and a part of the non-subpixel area;
a second electrode arranged on an entire surface of the substrate having the organic light emitting layer;
an auxiliary electrode connected to the second electrode to apply an auxiliary voltage to the second electrode; and
an auxiliary electrode line to apply a voltage to the auxiliary electrode, the auxiliary electrode line being arranged on the same layer as that of the gate lines or the data lines,
wherein the non-subpixel area comprises a first area having the organic light emitting layer and a second area adjacent to the first area, and wherein the auxiliary electrode is arranged in the second area,
wherein the auxiliary electrode line and the auxiliary electrode are arranged directly on the same layer as the first electrode.

16. The organic light emitting display of claim 15, further comprising a partition arranged on the non-subpixel area to surround the organic light emitting layer, wherein the partition has an opening exposing a portion of the auxiliary electrode.

17. The organic light emitting display of claim 16, wherein the second electrode is connected to the auxiliary electrode through the opening.

18. The organic light emitting display of claim 1, wherein a voltage applied to the auxiliary electrode has the same level to that of a voltage applied to the second electrode.

19. An organic light emitting display, comprising:
a substrate;
a plurality of pixels arranged on the substrate, each pixel comprising a plurality of subpixels surrounded by a non-subpixel area, each subpixel having rounded vertices;
a plurality of gate lines extending in a first direction on the substrate;
a plurality of data lines extending in a second direction on the substrate, the data lines crossing the gate lines to define the subpixels together with the gate lines;
a first electrode arranged in each subpixel;
an organic light emitting layer arranged on the first electrode;
a second electrode arranged on the organic light emitting layer and a part of the non-subpixel area;
an auxiliary electrode connected to the second electrode to apply an auxiliary voltage to the second electrode, the auxiliary electrode being arranged in the non-subpixel area and between vertices of the subpixels, and
an auxiliary electrode line to apply a voltage to the auxiliary electrode, the auxiliary electrode line being arranged directly on the same layer as that of the gate lines or the data lines.

* * * * *